(12) United States Patent
Bordelon, Jr.

(10) Patent No.: US 7,701,242 B2
(45) Date of Patent: Apr. 20, 2010

(54) METHOD AND APPARATUS FOR ARRAY-BASED ELECTRICAL DEVICE CHARACTERIZATION

(75) Inventor: Terry James Bordelon, Jr., Flower Mound, TX (US)

(73) Assignee: Stratosphere Solutions, Inc., Sunnyvale, CA (US)

( * ) Notice: Subject to any disclaimer, the term of this patent is extended or adjusted under 35 U.S.C. 154(b) by 251 days.

(21) Appl. No.: 11/932,080

(22) Filed: Oct. 31, 2007

(65) Prior Publication Data

US 2009/0108865 A1    Apr. 30, 2009

(51) Int. Cl.
*G01R 31/26* (2006.01)
*G01R 31/00* (2006.01)

(52) U.S. Cl. .................................... 324/765; 324/770

(58) Field of Classification Search .................. 324/770
See application file for complete search history.

(56) References Cited

U.S. PATENT DOCUMENTS

| | | |
|---|---|---|
| 6,833,725 B2 | 12/2004 | Ohkawa et al. |
| 2006/0270357 A1 | 11/2006 | Puente, Sr. et al. |
| 2007/0145999 A1 | 6/2007 | Cano et al. |
| 2007/0164759 A1 | 7/2007 | Bordelon |

*Primary Examiner*—Ha Tran T Nguyen
*Assistant Examiner*—Roberto Velez
(74) *Attorney, Agent, or Firm*—Schneck & Schneck; Thomas Schneck; David M. Schneck

(57) ABSTRACT

An electronic circuit to determine current-voltage characteristics of a plurality of electronic devices under test. The electronic circuit is comprised of a plurality of individual test cells, each of the plurality of test cells is configured to electrically couple to a first terminal of one of the plurality of electronic devices under test and to a first current source. A second terminal of each of the plurality of electronic devices under test couples to a second current source. The circuit employs a current-based measurement method.

30 Claims, 7 Drawing Sheets

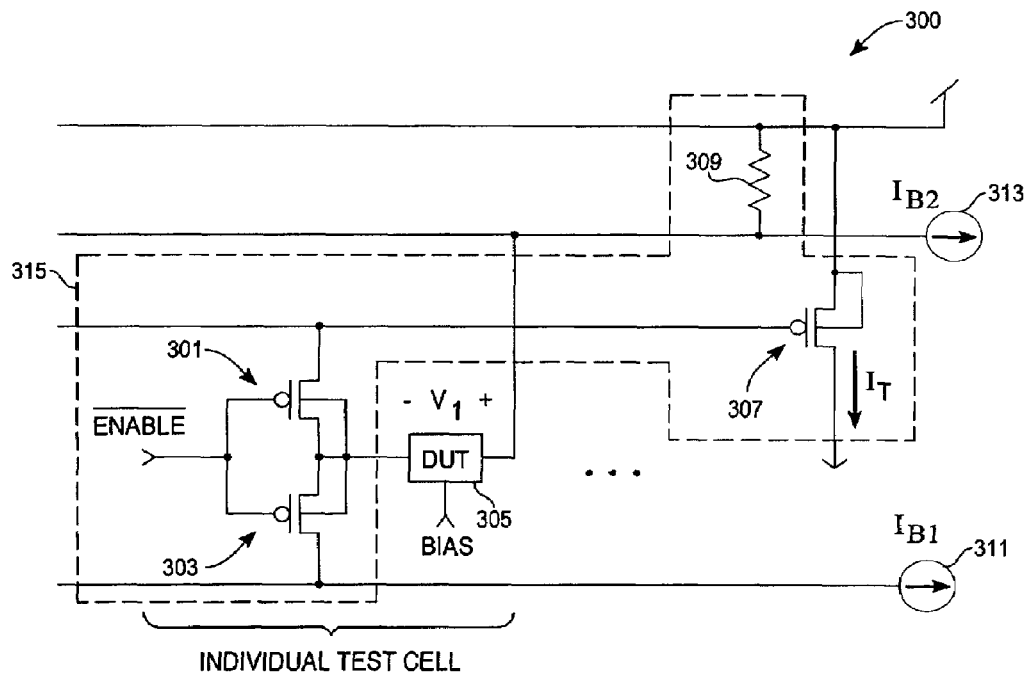
Fig._3
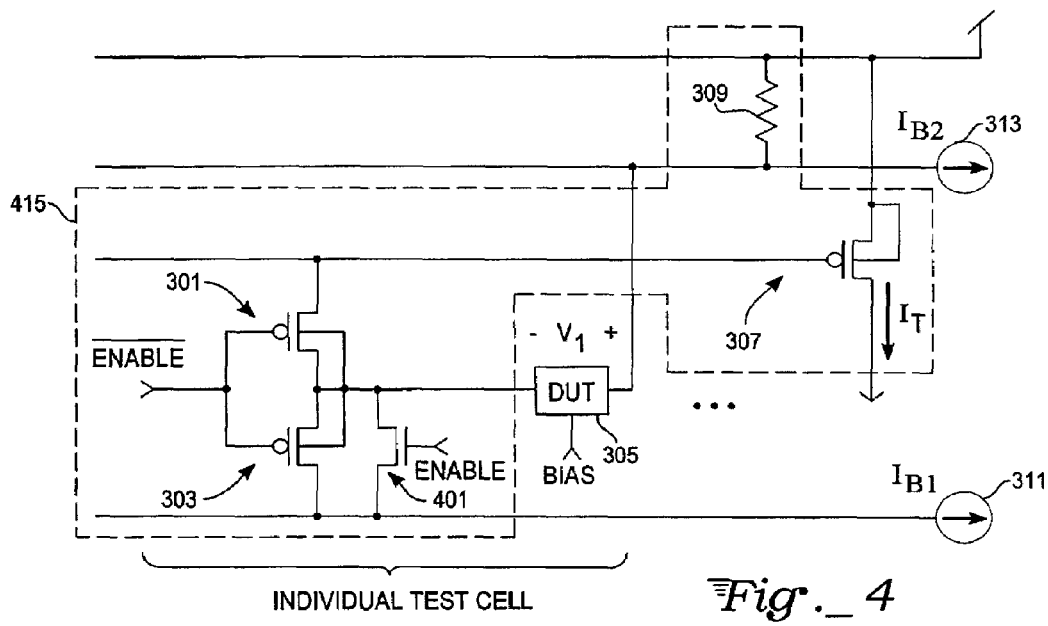
Fig._4

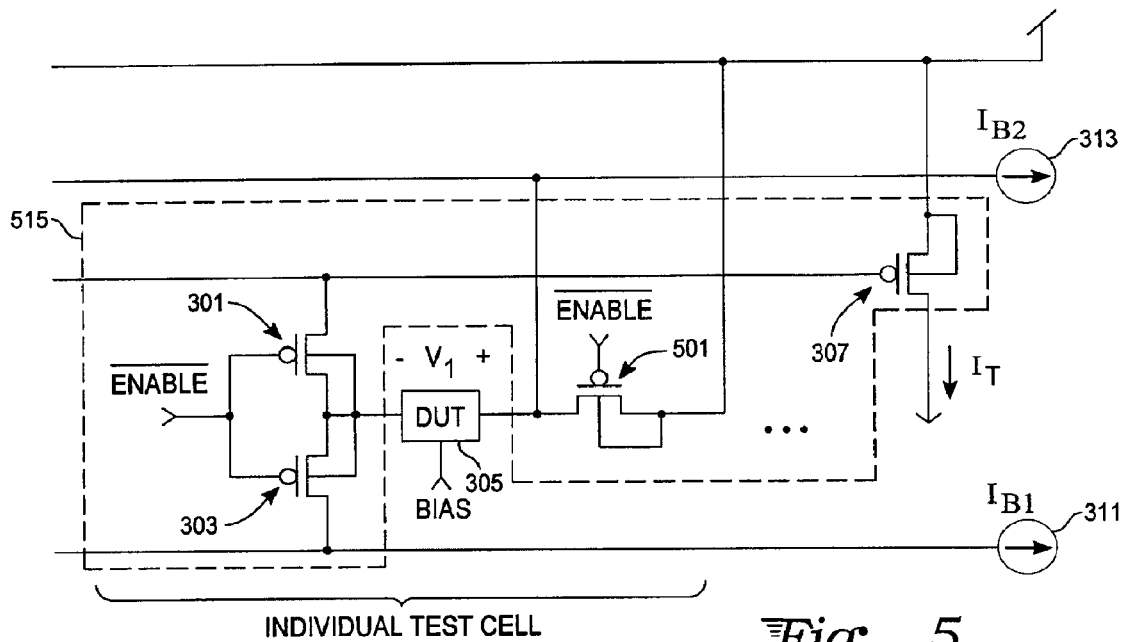
*Fig._5*
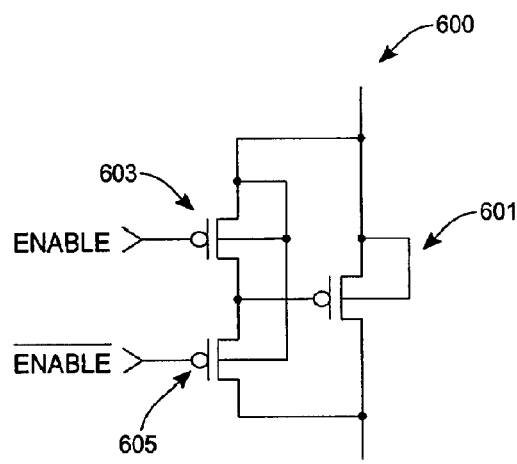
*Fig._6*

Fig. _ 9

METHOD AND APPARATUS FOR ARRAY-BASED ELECTRICAL DEVICE CHARACTERIZATION

TECHNICAL FIELD

The present invention is related generally to electronic testing. More specifically, the present invention is related to a method and apparatus for accurately and efficiently measuring electrical device properties when the devices are connected within an electrical circuit which allows independent and random access to individual devices and subsets of devices in an arrayed configuration.

BACKGROUND

The development of integrated circuit (IC) manufacturing requires fabrication of many different kinds of devices including transistors, resistors, and capacitors, as well as features patterned in various conducting layers which serve as resistive connectors (and are hence considered as resistor devices). In order to tune the manufacturing process to maximize yield, some classes of test devices are fabricated in very large numbers and exhaustively tested in order to find relatively rare failure events. Yield improvement can therefore be expensive from the standpoint of both consumed mask area and overall test time due to such large device sample sizes.

Improved characterization approaches have sought to decrease mask area and maximize the number and variety of structures testable at wafer level by creating addressable arrays of test devices. Wafer level test refers to the measurement of test devices by direct contact of measurement probes to large metal islands (i.e., probe pads) on the silicon wafer. An array of test devices uses either passive or active circuitry to selectively access (address) which device is to be tested. An array of devices can then share a common set of probe pads and improve mask density by orders of magnitude over conventional types of test devices which possess dedicated probe pads for wafer level test. Devices which are not selected for test are electrically isolated from the measurement nodes of the circuitry.

Early addressable array designs focused on characterization of simple devices such as interconnect and contacts. More sophisticated array designs included active test devices such as MOSFETs and even ring oscillators and capacitors.

Since the advent of quarter micron technology generation of silicon CMOS, increased attention has been given to array-based device testing as a means to characterize inherent variability in the IC manufacturing process. In contemporary sub-100 nm CMOS technologies, variability has become an acute problem demanding thorough statistical study using array-based approaches.

Various types of prior art devices have established dense test arrays for active and passive devices, ring oscillators, and proposed sets of test device types and sizes for elucidating variability parameters of the manufacturing process. Electrical testing is performed on each individually addressed element using conventional measurement techniques (e.g., force/sense, or Kelvin methods). Cost associated with mask area is reduced due to the high test device density achieved, but test time cost remains prohibitive.

What is needed is a current-based measurement approach to enable a highly dense test cell in order to minimize mask area and to also support a simultaneous test mode whereby a subset of devices are tested simultaneously. In this manner, a highly accelerated test capability is achieved which allows a flexible tradeoff between statistical resolution and test time.

SUMMARY OF THE INVENTION

In an exemplary embodiment, the invention is an electronic circuit to determine current-voltage characteristics of a plurality of electronic devices under test. The electronic circuit includes a plurality of individual test cells configured to electrically couple to a first terminal of one of each of the plurality of electronic devices under test. Each of the plurality of test cells includes a pair of switching devices coupled in series with one another and configured to receive an enable signal on a gate of each of the switching devices, a junction of the pair of switching devices configured to be coupled to the first terminal of the one of the plurality of devices under test, and a transconducting device having a gate coupled to a first end of the pair of switching devices. The electronic circuit further includes a first current source coupled to a second end of the pair of switching devices in each of the plurality of individual test cells and a second current source configured to be coupled to a second terminal of each of the plurality of electronic devices under test.

In another exemplary embodiment, the invention is an electronic circuit to determine current-voltage characteristics of a plurality of electronic devices under test. The electronic circuit includes a plurality of individual test cells configured to electrically couple to a first terminal of one of each of the plurality of electronic devices under test. Each of the plurality of test cells includes a pair of switching devices coupled in series with one another and configured to receive an enable signal on a gate of each of the switching devices, a junction of the pair of switching devices configured to be coupled to the first terminal of the one of the plurality of devices under test, and a transconducting device having a gate coupled to a first end of the pair of switching devices. The electronic circuit further includes a first current source coupled to a second end of the pair of switching devices in each of the plurality of individual test cells.

In another exemplary embodiment, the invention is an electronic circuit to determine current-voltage characteristics of a plurality of electronic devices under test. The electronic circuit includes an addressing circuit for accessing select one or ones of the plurality of electronic devices under test. The addressing circuit includes a counter/shift register circuit configured to produce an address defining one or more blocks containing devices under test, a mode control circuit coupled to the counter/shift register circuit and configured to produce a cell address and a block address. The electronic circuit further includes a plurality of individual test cells coupled to the mode control circuit and configured to electrically couple to a first terminal of one of each of the plurality of electronic devices under test. Each of the plurality of test cells includes a pair of switching devices coupled in series with one another and configured to receive an enable signal on a gate of each of the switching devices, a junction of the pair of switching devices is configured to be coupled to the first terminal of the one of the plurality of devices under test, and a transconducting device having a gate coupled to a first end of the pair of switching devices. The electronic circuit further includes a first current source coupled to a second end of the pair of switching devices in each of the plurality of individual test cells and a second current source configured to be coupled to a second terminal of each of the plurality of electronic devices under test.

In another exemplary embodiment, the invention is an electronic circuit to determine current-voltage characteristics of a plurality of electronic devices under test. The electronic circuit includes an addressing circuit for accessing select one or ones of the plurality of electronic devices under test. The addressing circuit includes a counter/shift register circuit configured to produce an address defining one or more blocks containing devices under test, a mode control circuit coupled to the counter/shift register circuit and configured to produce a cell address and a block address. The electronic circuit further includes a plurality of individual test cells coupled to the mode control circuit and configured to electrically couple to a first terminal of one of each of the plurality of electronic devices under test. Each of the plurality of test cells includes a pair of switching devices coupled in series with one another and configured to receive an enable signal on a gate of each of the switching devices, a junction of the pair of switching devices is configured to be coupled to the first terminal of the one of the plurality of devices under test, and a transconducting device having a gate coupled to a first end of the pair of switching devices. The electronic circuit further includes a first current source coupled to a second end of the pair of switching devices in each of the plurality of individual test cells.

BRIEF DESCRIPTION OF THE DRAWINGS

FIG. 3 is an exemplary embodiment of a transducer circuit of the present invention.

FIG. 4 is another exemplary embodiment of a transducer circuit which adds an NMOS transistor to a test cell in order to support higher test device current.

FIG. 5 is another exemplary embodiment of a transducer circuit which places a resistive load formed by a PMOS transistor within each individual test cell in order to reduce error caused by any parasitic line resistance.

FIG. 6 is an alternative embodiment of the resistive load of FIG. 5.

DETAILED DESCRIPTION

Various embodiments of the present invention disclose an electronic circuit and method to electrically characterize a collection of test devices in an arrayed configuration. The circuit employs a current-based measurement method realized through the use of a transducer circuit. The transducer circuit affords a small test cell size and enables a highly accelerated test mode whereby the subset of cells within a block are tested simultaneously. The test result is an average of the properties of the test devices within the test cells within a block.

Figure 1:
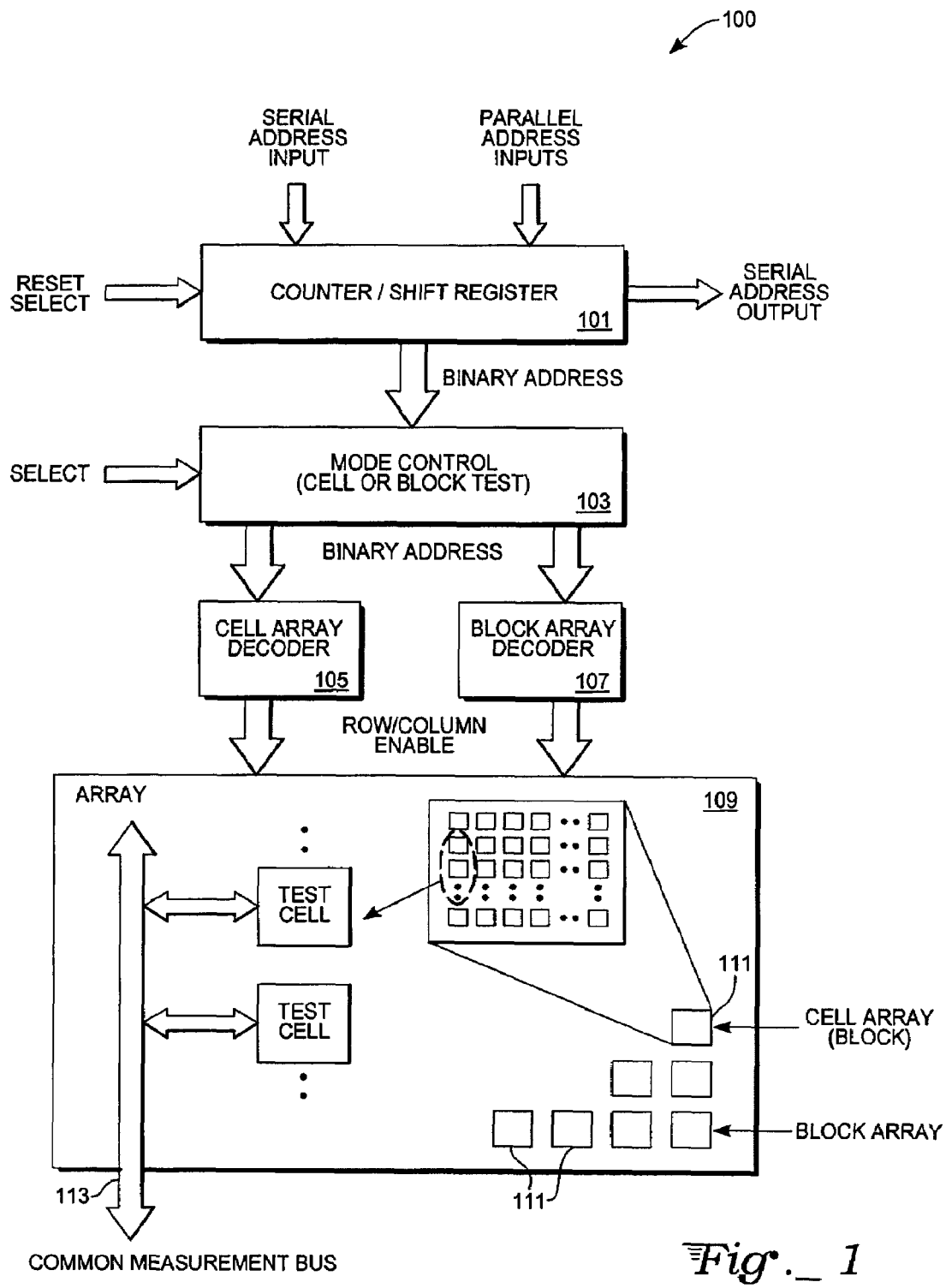
FIG. 1 is a block diagram of an exemplary addressing scheme and test array configuration of the present invention.

With reference to FIG. 1, an exemplary array-based device characterization circuit 100 includes a counter/shift register circuit 101, a mode control circuit 103, a cell array decoder 105, a block array decoder 107, and an array of test cells 109 which are grouped into a plurality of blocks 111. The counter/shift register circuit 101 produces a binary address. The binary address is used by the mode control circuit 103 to generate two binary addresses, one for block access and one for cell access within each of the plurality of blocks 111. In this exemplary embodiment, the mode control circuit 103 is used to select either individual cell access, or simultaneous access of all cells within a selected one of the plurality of blocks 111. When simultaneous cell access is selected, the binary address from the counter/shift register circuit 101 is used to create a block address which is then decoded by the block array decoder 107 to supply appropriate enable signals to the selected one of the plurality of blocks 111. In this mode, the mode control circuit 103 enables the addressing of all cells within the selected one of the plurality of blocks, thus connecting each of these cells to a common measurement bus 113. When individual cell access is selected, the mode control circuit 103 produces a hierarchical address whereby an appropriate one of the plurality of blocks 111 which contains the selected cell is addressed, and the selected cell within the appropriate block 111 is addressed. The cell array decoder 105 and the block array decoder 107 provide appropriate enable signals to the sub-array of cells within a selected one of the plurality of blocks 111 and to the array of test cells 109.

Figure 2:
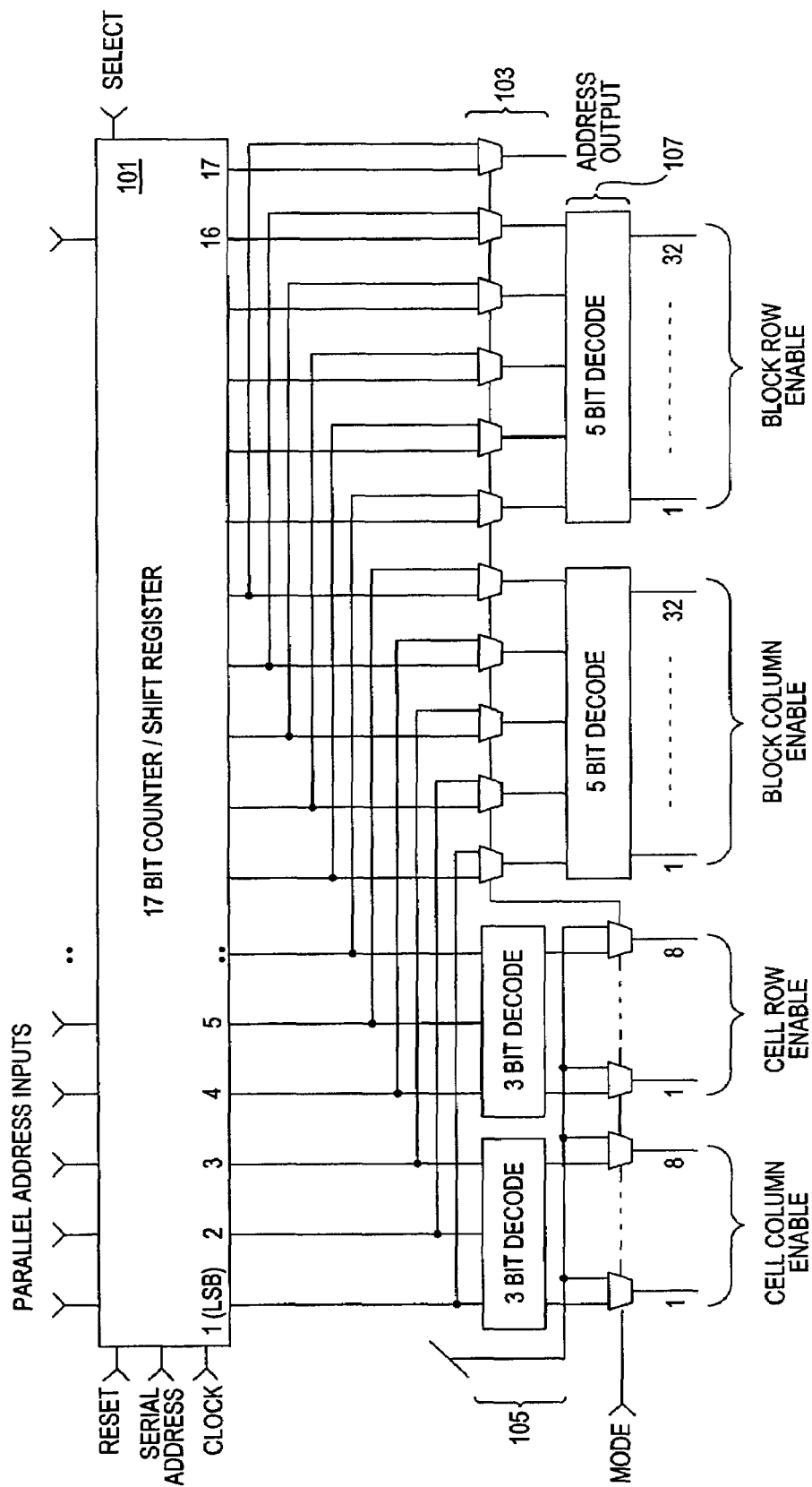
FIG. 2 is an exemplary embodiment of the exemplary addressing scheme of FIG. 1.

In FIG. 2 and with continued reference to FIG. 1, a specific exemplary embodiment of the counter/shift register circuit 101, the mode control circuit 103, the cell array decoder 105, and the block array decoder 107 for a 32×32 array of blocks (not shown in FIG. 2), each of which contain an 8×8 array of test cells (not shown in FIG. 2). The counter portion of the counter/shift register circuit 101 produces a sequential binary address with each clock pulse. The shift register portion of the counter/shift register circuit 101 loads a starting address either serially or from parallel address inputs. The mode control circuit 103 is realized by multiplexing the sequential binary address produced by the counter/shift register circuit 101 into the cell array decoder 105 and the block array decoder 107.

In simultaneous test mode of each cell in a block, a logic '1' is multiplexed onto an enable line of each cell, and a binary address input to the block array decoder 107 is shifted down by six bits through the multiplexer circuits on an input to the block array decoder 107. The binary address allows sequential access to each of the plurality of blocks 111 when the counter is incremented. In individual cell test mode, the counter causes sequential access of each cell address before incrementing the block address.

The embodiments of the exemplary array-based device characterization circuit 100 disclosed in FIGS. 1 and 2 are exemplary. The present invention encompasses the use of the simultaneous test of sub-groups of test devices selectable from within a larger set. Alternative circuit and addressing methods may be employed by one skilled in the art to realize this selection function. A skilled artisan will also recognize that the array-based device characterization circuit 100 may be readily scaled for larger arrays of test cells and various block cells within the array.

In FIG. 3, an exemplary test block 300 consists of an array of individual test cells (only one is shown for clarity). Each of the test cells is activated through an 'enable' signal supplied from the cell decoder (FIG. 1). Each test cell includes a first PMOS transistor 301 and a second PMOS transistor 303, and a device under test (DUT) 305. The exemplary test block 300 also includes a PMOS sense transistor 307 and load resistor 309. The first 301 and second 303 PMOS transistors, the PMOS sense transistor 307, and the load resistor 309 comprise a transducer circuit 315. In a specific exemplary embodiment, the load resistor may have a resistance value range of 2000 to 4000 ohms.

Each cell circuit, as well as the PMOS sense transistor 307 and the load resistor 309 are electrically coupled to a set of common measurement lines for the exemplary test block 300. One line is held at a constant supply voltage while the other two are driven by a first current source 311 supplying $I_{B1}$ and a second current source 313 supplying $I_{B2}$. The drain terminal of the PMOS sense transistor 307 produces an output current of the transducer circuit 315 which is also supplied to a common measurement line. The measurement lines of each block are then connected through block pass-gates (not shown) to a single set of measurement lines for the array of individual test cells. The block passgates are enabled by the block array decoder 107 (FIG. 1).

With continued reference to FIG. 3, the transducer circuit 315 employs a variant of the apparatus and method described in U.S. patent application Ser. No. 11/619,333 ("the '333 application"), filed Jan. 3, 2007, entitled "Method and Apparatus for Measurement of Electrical Resistance," which is hereby incorporated by reference. In the invention disclosed herein, the PMOS sense transistor 307 is biased in the subthreshold region of operation by an appropriate constant voltage. The constant voltage is supplied in series with a voltage, $V_1$, applied to the DUT 305 to be measured. Current $I_{B1}$ is forced through the second PMOS transistor 303 and through the DUT 305. Current $I_{B2}$ is adjusted such that the current through the load resistor 309 remains constant, independent of the value of $I_{B1}$, thus producing a constant voltage across the load resistor 309. In the invention of the '333 application, the PMOS sense transistor 307 gate is directly connected to the DUT 305. The present invention adds the first PMOS transistor 301 such that the gate of the PMOS sense transistor 307 is connected to the DUT 305 only when the test cell is accessed through an ENABLE signal. The use of first PMOS transistor 301 allows the PMOS sense transistor 307 and the load resistor 309 to be used for a plurality of individual test cells.

When an individual test cell is accessed by setting its ENABLE state to logic '1' ($\overline{ENABLE}$ to '0'), current $I_{B1}$ is forced through the DUT 305 producing a voltage $V_1$ which is added to the constant voltage across the load resistor 309. The summation of these voltages drives the gate of the PMOS sense transistor 307 to produce current $I_T$. Thus, a transducer function is realized which converts the voltage across the DUT 305 to a specific current $I_T$ whose magnitude will depend upon $I_{B1}$ and $I_{B2}$. The same differential measurement technique described in the '333 application is used to determine a resistance of the DUT 305 (or effectively the voltage of the DUT 305) without requiring knowledge of the precise value of the load resistor 309 or properties of the first 301 and second 303 PMOS transistors. $I_{B1}$ and $I_{B2}$ are known currents which are typically created by external sources.

FIG. 4 shows an alternative exemplary embodiment of a cell transducer circuit 415 which uses an NMOS transistor 401. The NMOS transistor 401 is driven by an ENABLE signal thus forming a pass-gate together with the second PMOS transistor 303. This embodiment has an advantage of reducing the resistance in series with the DUT 305 thus allowing a higher bias current $I_{B1}$ which is forced through the DUT 305.

FIG. 5 shows another alternative embodiment of an individual test cell 515. In this embodiment, the load resistor 309 (FIGS. 3 and 4) is replaced by a fourth PMOS transistor 501 in each test cell. The fourth PMOS transistor 501 serves as a load resistance that is local to each test cell. An advantage of this approach is that it reduces any potential error caused by parasitic interconnect resistance which may be in series with the load resistor 309 and the DUT 305. The fourth PMOS transistor 501 is biased in the linear region and produces a constant voltage drop when passing a constant current produced by suitable choice of $I_{B1}$ and $I_{B2}$.

FIG. 6 shows an alternative embodiment of the local load resistance shown by the fourth PMOS transistor 501 (FIG. 5) in which a first 601, second 603, and third 605 PMOS transistors are used. The second 603 and third 605 PMOS transistors serve to connect the gate of the first PMOS transistor 601 to either its source or drain. When ENABLE is at logic level "1," the third PMOS transistor 605 is conducting, connecting the gate of the first PMOS transistor 601 to its drain and forming a two-terminal resistor. When ENABLE is at logic level "0," the second PMOS transistor 603 is conducting, connecting the gate of the first PMOS transistor 601 to its source and effectively creating an open circuit condition from the drain to source of the first PMOS transistor 601. One benefit of this embodiment of the load resistance is that the load resistance is not sensitive to variations in the supply voltage applied to the source terminal of the first PMOS transistor 601.

Figure 7:
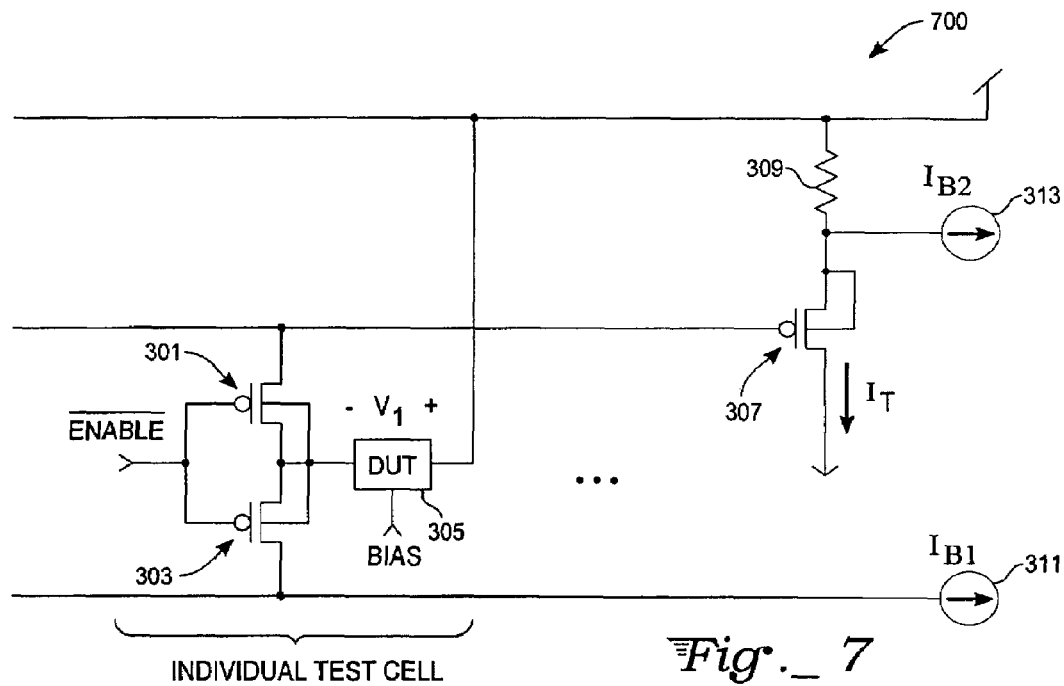
FIG. 7 is another exemplary embodiment of a transducer circuit which places a load resistance in series with a PMOS sense transistor in order to more accurately test larger test device resistances.

FIG. 7 shows an alternative embodiment of the PMOS sense transistor 307 and the load resistor for an exemplary test block 700 which is amenable for large resistance values of a DUT 305. The load resistor 309 is placed in series with the PMOS sense transistor 307, and the DUT 305 is electrically coupled directly to the supply voltage line. A constant voltage is thus created in series with the PMOS sense transistor 307, thus allowing the PMOS sense transistor 307 to remain in subthreshold conduction with a larger voltage drop across the DUT 305.

Figure 8:
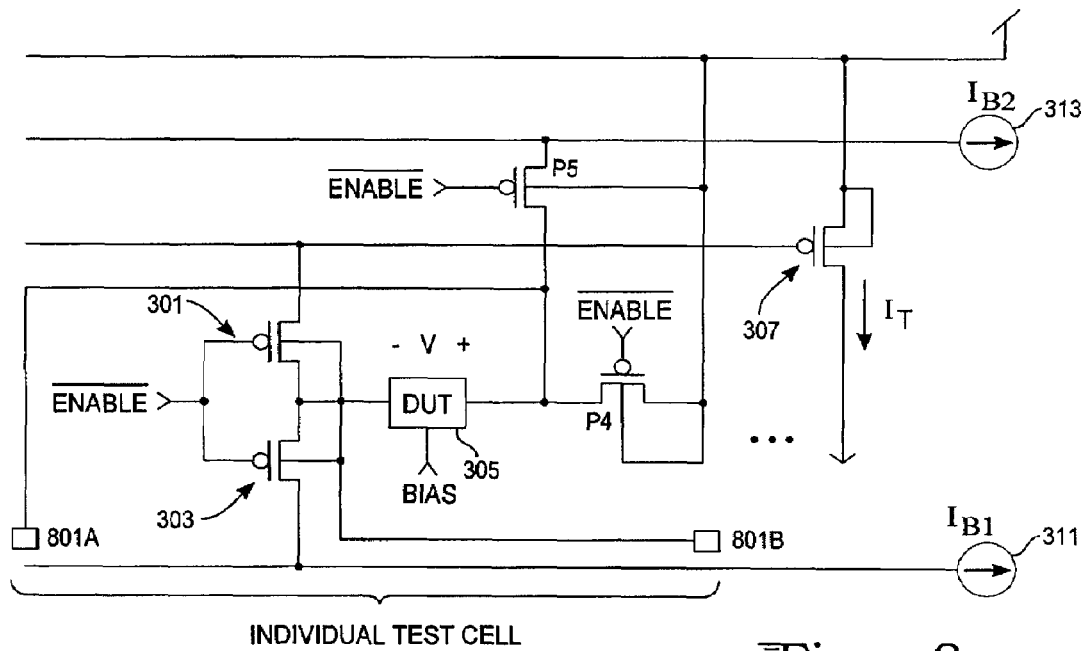
FIG. 8 is another exemplary embodiment of a transducer circuit which allows test devices to be connected in series with one another.

FIG. 8 shows another alternative embodiment of the test cell which allows the DUT 305 to be connected in series with DUTs in other test cells (not shown). The first 801A and second 801B terminals shown in FIG. 8 are connected to similar terminals in other test cells by connecting the first terminal 801A to the second terminal 801B of the previous cell (not shown), and the second terminal 801B of the current cell to the first terminal 801A of a subsequent cell (not shown). All cells within a block are thus connected in a similar fashion. This configuration allows individual cells to be accessed and tested as with the other test cell embodiments, and also provides a test mode whereby the first and last cells within a block are accessed in such a way as to measure the total series resistance of all the DUTs within the block.

Figure 9:
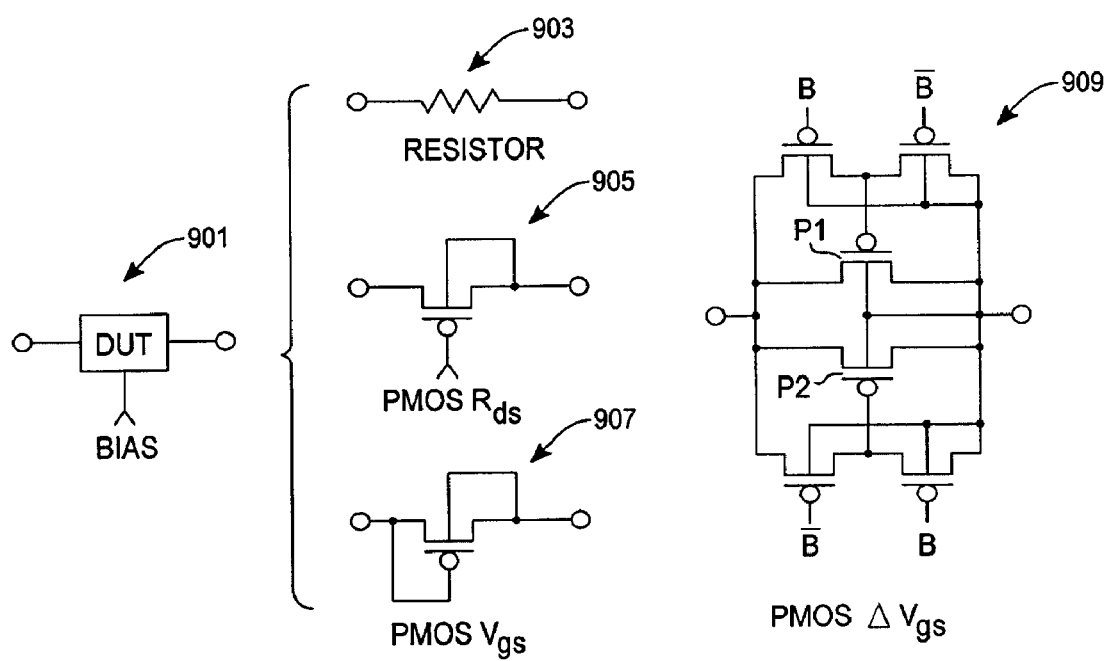
FIG. 9 shows exemplary embodiments of a device under test (DUT) to be used in conjunction with the present invention.

With reference to FIG. 9, various exemplary embodiments of different types of DUTs are shown in configurations suitable for test by various embodiments of the present invention. These embodiments are meant as illustrative examples only. As will be recognized by a skilled artisan, many other test device types and configurations are possible using various embodiments of the present invention.

For example, a simple two terminal resistor 903 is testable without the need for an auxiliary bias terminal. Also, the drain-source resistance ($R_{ds}$) of a first PMOS transistor 905 is testable as a function of a variable gate voltage supplied by the bias pin. The gate voltage ($V_{gs}$) required to produce a certain drain current of a second PMOS transistor 907 may also be measured, and may also serve to measure threshold voltage defined by a constant current level. A complementary circuit 909 may be used to measure a mismatch in gate-source voltage between a pair of PMOS transistors (P1 and P2) by utilizing the bias pin to generate complementary signals which alternatively turn one transistor on and then the other.

Advantages of Embodiments of the Invention Over Prior Art

Referring again to FIG. 3, an advantage of the present invention is that the PMOS sense transistor 307 and the load resistor 309 are removed from the individual test cell, reducing its size. The test cell contains only the first 301 and second 303 PMOS transistor in addition to the DUT 305. Utilizing the measurement method described in the '333 application, a highly precise and accurate analog measurement of the DUT 305 is achieved. The analog measurement is insensitive to the electrical parasitics of the test device array circuitry. The prior art of array-based characterization approaches have not been able to realize as sensitive an analog test when using such few test cell elements.

A further advantage of the present invention is that the overall test time is reduced. The PMOS sense transistor 307 is characterized prior to measurement of the DUT 305 (refer to the '333 application for a detailed description). Since the PMOS sense transistor 307 is now shared by all the cells within a block, fewer transistors must be characterized for a given total number of test cells. By merely measuring current $I_T$, no voltage measurement is required. Accurate voltage measurement typically require longer test time due to noise and thermal drift and other similar settling issues with the test instrumentation.

A further advantage of the present invention is that simultaneous test of all cells in a block allows for a highly accelerated test whereby the test current for the block produces an average of the DUT voltages within the block. The block average value is useful for many types of analyses, and it provides the user with a usage mode which trades statistical resolution for test time.

Figure 10:
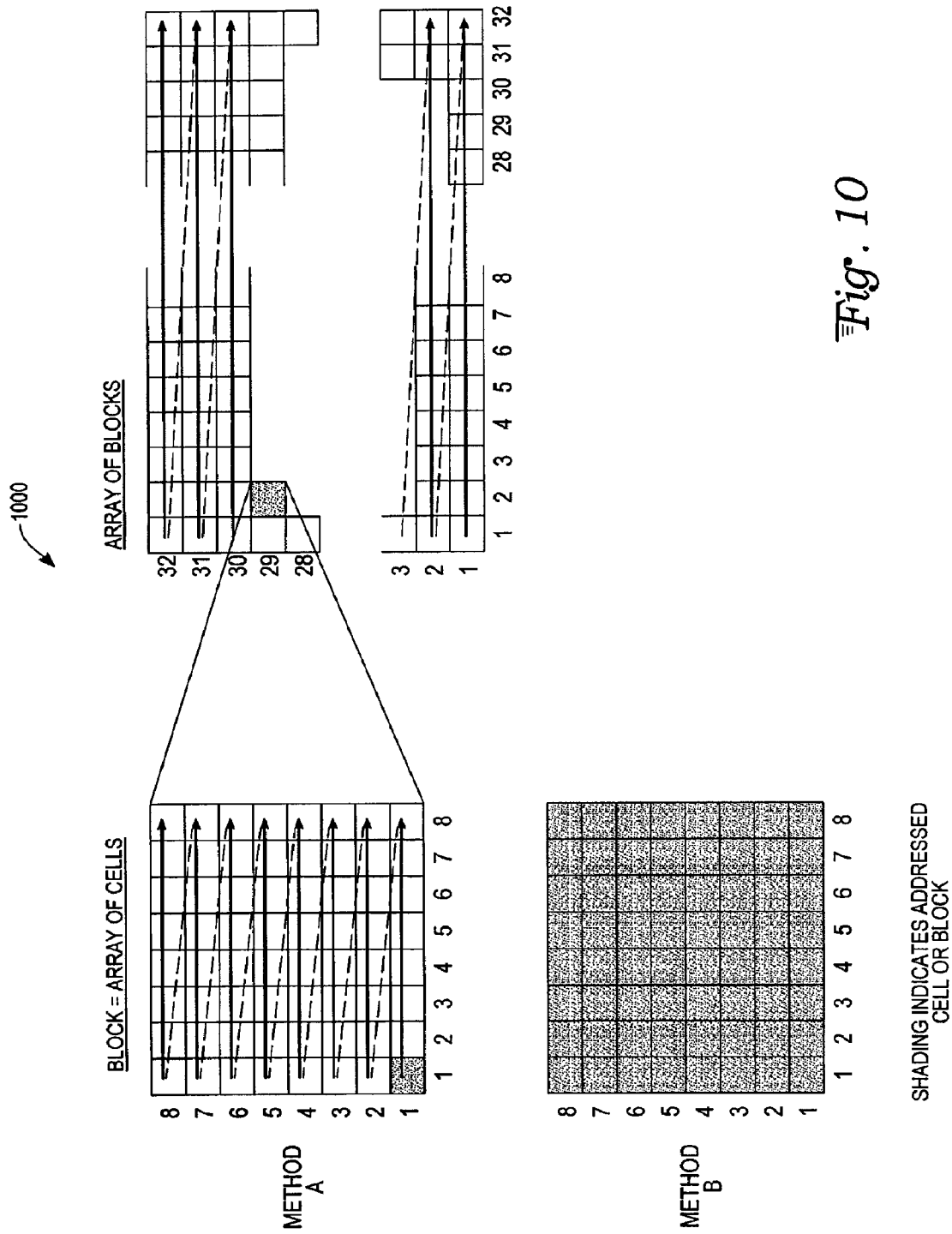
FIG. 10 shows various schemes for electronic testing of cells.

FIG. 10 shows an addressing sequence for individual cell test (Method A) and for simultaneous test of all cells within a single block (Method B). In both methods, a block is first addressed. In Method B, the cell addressing circuitry simultaneously accesses all cells within the block. Appropriate force currents are then applied to all cells, and the resulting test current is measured as the sum of test currents from all cells within the block. When divided by the number of cells in the block, the summed test current provides the average test current for the block.

With reference again to FIG. 8, the specific test cell embodiment shown therein supports another type of simultaneous test whereby a single measurement is made of the series connection of all test devices within the block. In this case, the resulting test current is not a sum of test currents from the individual cell test currents, but a single cell test current generated from a single DUT formed by the series connection of all cell DUTs in the block.

In the foregoing specification, the present invention has been described with reference to specific embodiments thereof. It will, however, be evident to a skilled artisan that various modifications and changes can be made thereto without departing from the broader spirit and scope of the present invention as set forth in the appended claims. For example, all embodiments described utilize at least some 'p-type' transistor elements. Each embodiment can be readily transformed into a version which uses 'n-type' transistor elements in a straightforward manner apparent to one skilled in the art of basic transistor circuit design. A scope of the present invention covers such cases which are constructed through simple polarity reversal of voltages and currents, thereby retaining the same claims as the invention embodiments described in detail. Further, other non-linear control devices besides those shown can be used to realize basic non-linear behavior in the circuitry. Additionally, a skilled artisan will recognize that various types of transistor technology may be employed for the various embodiments described herein. These other technologies include, for example, BiCMOS, DMOS, or other switching and transconducting device circuitry. These technologies may be implemented in, for example, silicon or other elemental semiconductors, Group III-V or II-VI compound semiconductors, and various alloys thereof or various substrate types such as silicon-on-insulator or even non-standard substrates such as a polyethyleneterephthalate (PET) substrate deposited with silicon dioxide and polysilicon followed by an excimer laser annealing (ELA) anneal step. Each of these technology types and materials are recognizable to a skilled artisan. These and various other embodiments are all within a scope of the present invention. The specification and drawings are, accordingly, to be regarded in an illustrative rather than a restrictive sense.

What is claimed is:

1. An electronic circuit to determine current-voltage characteristics of a plurality of electronic devices under test, the electronic circuit comprising:
    a plurality of individual test cells, each of the plurality of individual test cells configured to electrically couple to a first terminal of one of each of the plurality of electronic devices under test, each of the plurality of test cells including:
        a pair of switching devices coupled in series with one another and configured to receive an enable signal on a gate of each of the switching devices, a junction of the pair of switching devices configured to be coupled to the first terminal of the one of the plurality of devices under test; and
        a transconducting device having a gate coupled to a first end of the pair of switching devices; and
    a first current source coupled to a second end of the pair of switching devices in each of the plurality of individual test cells; and
    a second current source configured to be coupled to a second terminal of each of the plurality of electronic devices under test.

2. The electronic circuit of claim 1 further comprising an addressing means for accessing select one or ones of the plurality of electronic devices under test.

3. The electronic circuit of claim 2 wherein the select one or ones of the plurality of electronic devices under test are accessed by coupling the addressing means to binary bit pattern input means.

4. The electronic circuit of claim 1 further comprising a load resistor coupled to a constant voltage source and configured to supply each of the plurality of devices under test with a constant voltage offset.

5. The electronic circuit of claim 1 wherein each of the pair of switching devices and the transconducting device is a transistor.

6. The electronic circuit of claim 5 wherein each of the transistors is a PMOSFET device.

7. The electronic circuit of claim 1 further comprising a third switching device coupled between the first current source and the junction of the pair of switching devices, the third switching device configured to conduct on an applied enable signal that is complementary to the enable signal applied to the pair of switching devices.

8. The electronic circuit of claim 1 further comprising a resistive device configured to be coupled in series with one of the plurality of electronic devices under test and a constant voltage source, the resistive device configured to conduct on an applied enable signal allowing current flow to at least one of the plurality of electronic devices under test.

9. The electronic circuit of claim 1 further comprising a current switching device configured to be coupled between the second current source and the second terminal of each of the plurality of electronic devices under test, the current switching device further configured to conduct on an applied enable signal.

10. An electronic circuit to determine current-voltage characteristics of a plurality of electronic devices under test, the electronic circuit comprising:
   a plurality of individual test cells, each of the plurality of individual test cells configured to electrically couple to a first terminal of one of each of the plurality of electronic devices under test, each of the plurality of test cells including:
      a pair of switching devices coupled in series with one another and configured to receive an enable signal on a gate of each of the switching devices, a junction of the pair of switching devices configured to be coupled to the first terminal of the one of the plurality of devices under test; and
      a transconducting device having a gate coupled to a first end of the pair of switching devices; and
   a first current source coupled to a second end of the pair of switching devices in each of the plurality of individual test cells.

11. The electronic circuit of claim 10 further comprising:
   a second current source configured to be coupled to a second terminal of each of the plurality of electronic devices under test; and
   a passgate configured to be coupled between the first current source and the first terminal of one of the plurality of devices under test.

12. The electronic circuit of claim 11 further comprising a current switching device configured to be coupled between the second current source and the second terminal of each of the plurality of electronic devices under test, the current switching device further configured to conduct on an applied enable signal.

13. The electronic circuit of claim 10 wherein a second terminal of each of the plurality of devices under test is configured to be coupled to a constant voltage source.

14. The electronic circuit of claim 10 further comprising an addressing means for accessing select one or ones of the plurality of electronic devices under test.

15. The electronic circuit of claim 14 wherein the select one or ones of the plurality of electronic devices under test are accessed by coupling the addressing means to binary bit pattern input means.

16. The electronic circuit of claim 10 further comprising a load resistor, the load resistor configured to be coupled between a constant voltage source and in series with the transconducting device.

17. The electronic circuit of claim 10 wherein each of the pair of switching devices and the transconducting device is a transistor.

18. The electronic circuit of claim 17 wherein each of the transistors is a PMOSFET device.

19. The electronic circuit of claim 10 further comprising a third switching device coupled between the first current source and the junction of the pair of switching devices, the third switching device configured to conduct on an applied enable signal that is complementary to the enable signal applied to the pair of switching devices.

20. The electronic circuit of claim 10 further comprising a resistive device configured to be coupled in series with one of the plurality of electronic devices under test and a constant voltage source, the resistive device configured to conduct on an applied enable signal allowing current flow to at least one of the plurality of electronic devices under test.

21. An electronic circuit to determine current-voltage characteristics of a plurality of electronic devices under test, the electronic circuit comprising:
   an addressing circuit for accessing select one or ones of the plurality of electronic devices under test, the addressing circuit including:
      a counter/shift register circuit configured to produce an address defining one or more blocks containing devices under test;
      a mode control circuit coupled to the counter/shift register circuit, the mode control circuit configured to produce a cell address and a block address; and
   a plurality of individual test cells coupled to the mode control circuit, each of the plurality of individual test cells configured to electrically couple to a first terminal of one of each of the plurality of electronic devices under test, each of the plurality of test cells including:
      a pair of switching devices coupled in series with one another and configured to receive an enable signal on a gate of each of the switching devices, a junction of the pair of switching devices configured to be coupled to the first terminal of the one of the plurality of devices under test; and
      a transconducting device having a gate coupled to a first end of the pair of switching devices; and
   a first current source coupled to a second end of the pair of switching devices in each of the plurality of individual test cells; and
   a second current source configured to be coupled to a second terminal of each of the plurality of electronic devices under test.

22. The electronic circuit of claim 21 further comprising a cell array decoder and a block array decoder coupled between the mode control circuit and the plurality of individual test cells, the cell array decoder configured to provide a first set of one or more enable signals to select ones of the plurality of individual test cells, and the block decoder configured to provide a second set of one or more enable signals within a selected one of the one or more blocks.

23. The electronic circuit of claim 21 further comprising a third switching device coupled between the first current source and the junction of the pair of switching devices, the third switching device configured to conduct on an applied enable signal that is complementary to the enable signal applied to the pair of switching devices.

24. The electronic circuit of claim 21 further comprising a resistive device configured to be coupled in series with one of the plurality of electronic devices under test and a constant voltage source, the resistive device configured to conduct on an applied enable signal allowing current flow to at least one of the plurality of electronic devices under test.

25. The electronic circuit of claim 21 further comprising a load resistor, the load resistor coupled to a constant voltage source and configured to supply each of the plurality of devices under test with a constant voltage offset.

26. An electronic circuit to determine current-voltage characteristics of a plurality of electronic devices under test, the electronic circuit comprising:

an addressing circuit for accessing select one or ones of the plurality of electronic devices under test, the addressing circuit including:
- a counter/shift register circuit configured to produce an address defining one or more blocks containing devices under test;
- a mode control circuit coupled to the counter/shift register circuit, the mode control circuit configured to produce a cell address and a block address; and a plurality of individual test cells, each of the plurality of individual test cells configured to electrically couple to a first terminal of one of each of the plurality of electronic devices under test, each of the plurality of test cells including:
- a pair of switching devices coupled in series with one another and configured to receive an enable signal on a gate of each of the switching devices, a junction of the pair of switching devices configured to be coupled to the first terminal of the one of the plurality of devices under test; and
- a transconducting device having a gate coupled to a first end of the pair of switching devices; and a first current source coupled to a second end of the pair of switching devices in each of the plurality of individual test cells.

27. The electronic circuit of claim 26 further comprising:
- a second current source configured to be coupled to a second terminal of each of the plurality of electronic devices under test; and
- a passgate configured to be coupled between the first current source and the first terminal of one of the plurality of devices under test.

28. The electronic circuit of claim 26 further comprising a cell array decoder and a block array decoder coupled between the mode control circuit and the plurality of individual test cells, the cell array decoder configured to provide a first set of one or more enable signals to select ones of the plurality of individual test cells, and the block decoder configured to provide a second set of one or more enable signals within a selected one of the one or more blocks.

29. The electronic circuit of claim 26 wherein a second terminal of each of the plurality of devices under test is configured to be coupled to a constant voltage source.

30. The electronic circuit of claim 26 further comprising a load resistor, the load resistor configured to be coupled between a constant voltage source and in series with the transconducting device.

* * * * *